(12) United States Patent
Kim

(10) Patent No.: US 6,800,529 B2
(45) Date of Patent: Oct. 5, 2004

(54) METHOD FOR FABRICATING SEMICONDUCTOR TRANSISTOR DEVICE

(75) Inventor: Tae Woo Kim, Kyoungki-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 10/325,120

(22) Filed: Dec. 20, 2002

(65) Prior Publication Data

US 2003/0119269 A1 Jun. 26, 2003

(30) Foreign Application Priority Data

Dec. 24, 2001 (KR) .............................. 10-2001-0084006

(51) Int. Cl.[7] .............................................. H01L 21/336
(52) U.S. Cl. .................... 438/289; 438/302; 438/525; 257/240; 257/285
(58) Field of Search ................... 438/521–529, 438/298–302, 289, 282, 276, 268, 217, 194, 175, 549; 257/240, 285

(56) References Cited

U.S. PATENT DOCUMENTS

| 5,296,401 | A | | 3/1994 | Mitsui et al. |
| 5,550,069 | A | | 8/1996 | Roth |
| 5,675,172 | A | * | 10/1997 | Miyamoto et al. ........... 257/402 |
| 6,300,201 | B1 | * | 10/2001 | Shao et al. .................. 438/281 |
| 6,426,258 | B1 | * | 7/2002 | Harada et al. ............... 438/268 |

* cited by examiner

*Primary Examiner*—Matthew Smith
*Assistant Examiner*—Calvin Lee
(74) *Attorney, Agent, or Firm*—Timothy J. Keefer; Seyfarth Shaw LLP

(57) ABSTRACT

The present invention relates to a method for fabricating a semiconductor transistor device. The method comprises: forming a first conductive type well in a semiconductor substrate having a device isolation film formed thereon; implanting first conductive type impurity ions into the first conductive type well, so as to form a punch-through stopper region; implanting the first conductive type impurity ions into the upper portion of the resulting structure at fixed tilt angle and ion implantation energy, so as to form a channel region; forming a gate electrode including a gate insulating film on the semiconductor substrate; forming LDD regions in the semiconductor substrate at both sides of the gate electrode; forming an insulating spacer film on the side of the gate electrode; and forming source and drain regions in the semiconductor substrate at portions below the sides of the insulating spacer films.

6 Claims, 4 Drawing Sheets

| CHANNEL THRESHOLD VOLTAGE / ION IMPLANTATION ENERGY[keV] | SATURATION CURRENT | | GATE CONDUCTANCE PEAK | |
|---|---|---|---|---|
| | L=0.18 | L=10 | L=0.18 | L=10 |
| 110k | 189 | 2.9 | 393 | 5.74 |
| 120k | 201 | 3.1 | 409 | 5.88 |
| 130k | 219 | 3.3 | 426 | 6.01 |

FIG.5

| CHANNEL THRESHOLD VOLTAGE / ION IMPLANTATION ENERGY[keV] | SATURATION CURRENT | | GATE CONDUCTANCE PEAK | |
|---|---|---|---|---|
| | L=0.18 | L=10 | L=0.18 | L=10 |
| 110k | 189 | 2.9 | 393 | 5.74 |
| 120k | 201 | 3.1 | 409 | 5.88 |
| 130k | 219 | 3.3 | 426 | 6.01 |

METHOD FOR FABRICATING SEMICONDUCTOR TRANSISTOR DEVICE

BACKGROUND OF THE INVENTION

1. Field of the Invention

The present invention relates to a method for fabricating a semiconductor transistor device. More particularly, the present invention relates to a method for fabricating a semiconductor transistor device, which allows the saturation current of a PMOS transistor to be increased, thereby increasing the reliability of the PMOS transistor.

2. Description of the Prior Art

Generally, as the integration density of a semiconductor device increases, higher doping concentration levels in a well are required in order to improve the short channel effect caused by a reduction in the gate length of a transistor. However, an increase in the well doping concentration causes the effect of carrier scattering in a channel, so that saturation current is decreased due to a reduction in carrier mobility.

The carrier scattering effect is a phenomenon that a free carrier collides with ions with movement and loses its intrinsic energy in each collision with the ions, so that it fails to reach a target due to a reduction in velocity energy. This carrier scattering effect increases as the doping concentration in a channel region increases. Thus, the probability of the collision of the free carrier with the ions increases, so that the carrier mobility becomes smaller.

FIGS. 1a to 1c are cross-sectional views, which illustrate a method for fabricating a PMOS transistor according to the prior art.

As shown in FIG. 1, a device isolation film 11 is formed on a semiconductor substrate 10, into which phosphorus ions ($P^+$) impurity ions are then implanted at the ion implantation energy of 1.0E13/500 KeV and title angels of $\alpha=0$ degree and $\beta=0$ degree so as to form an n-type well 12. A pad oxide film 13 is then deposited on the upper surface of the substrate 10 by an oxidation process. A punch-though stopper region 14 is then formed in the substrate 10 by an ion implantation process, after which a region for controlling channel threshold voltage 15 is formed in the substrate 10 by an ion implantation process. In forming the region for controlling channel threshold 15, there are used As impurities, the ion implantation energy of 7.0E12/100 KeV, and the tilt angle of 7 degree.

As shown in FIG. 1b, the pad oxide 13 is removed, and a gate insulating film 16 and a gate electrode 17 are successively formed on the upper surface of the resulting structure. Next, using the gate electrode 17 as a mask, impurity ions are implanted into the substrate 10 at low concentration, so that LDD regions 18 are formed in the substrate 10 at portions below both sides of the gate electrode 17.

As shown in FIG. 1c, an insulating film is then deposited on the entire structure including the gate electrode 17, and etched back, so that insulating spacer films 19 are formed on both sides of the gate electrode 17. Thereafter, using the insulating spacer films 19 as a mask, impurity ions are implanted into the substrate 10, so that source/drain regions 20 are formed in the substrate 10.

However, the prior method for fabricating the semiconductor transistor device as described above has the following problems.

When implanting impurity ions into the substrate in order to form the channel threshold voltage-controlling region, if the As impurity ions are implanted at the ion implantation energy of 7.0E12/100 KeV and the tilt angle of 7 degree, carrier mobility will be reduced due to an increase in the carrier scattering effect. As a result, saturation current is reduced, so that device characteristics are deteriorated, thereby reducing device reliability and yield.

If a SSR (super steep retrograde well) process is used in order to solve such problems, ion sources for ion implantation, which are basically different from the above method, are generally used. In the SSR process, indium is generally used instead of boron (B), and antimony (Sb) is used instead of phosphorus (P) or arsenic (As). Since these atoms has very high mass, they hardly diffuse during subsequent processes. Thus, these atoms have an advantage in that they allow a steep well profile to be realized.

However, for this purpose, an ion source needs to be connected to ion implantation equipment. Also, since these atoms cause the contamination of a chamber, the contaminated chamber must be subjected to a cleaning process after each ion implantation.

As a result, the SSR process has many problems in terms of mass production, maintenance and repair.

SUMMARY OF THE INVENTION

Accordingly, the present invention has been made to solve the above-mentioned problems occurring in the prior art, and an object of the present invention is to provide a method for fabricating a semiconductor transistor device, in which energy and tilt angle for ion implantation at ion implantation for controlling channel threshold voltage are changed, so that the doping concentration in a channel region is reduced, so as to decrease the carrier scattering effect of the device, thereby reducing the saturation current of the device.

To achieve the above object, the present invention provides a method for fabricating a semiconductor transistor device, which comprises the steps of: forming a first conductive type well in a semiconductor substrate having a device isolation film formed thereon; implanting first conductive type impurity ions into the first conductive type well so as to form a punch-through stopper region; implanting the first conductive type impurity ions into the upper portion of the resulting substrate structure at fixed tilt angle and ion energy, so as to form a channel region; forming a gate electrode including a gate insulating film on the semiconductor substrate; forming LDD regions in the semiconductor substrate at both sides of the gate electrode; forming insulating spacer films on both sides of the gate electrode; and forming source and drain regions in the semiconductor substrate at the sides of the insulating spacer films.

BRIEF DESCRIPTION OF THE DRAWINGS

The above and other objects, features and advantages of the present invention will be more apparent from the following detailed description taken in conjunction with the accompanying drawings, in which:

FIG. 5 is a drawing, which shows the relation between saturation current and gate conductance according to ion implantation energy, in a transistor fabricated according to the preferred embodiment of the present invention.

DETAILED DESCRIPTION OF THE PREFERRED EMBODIMENTS

Hereinafter, a method for fabricating a semiconductor transistor device according to a preferred embodiment of the present invention will be described in detail with reference to the accompanying drawings.

Figure 1A:
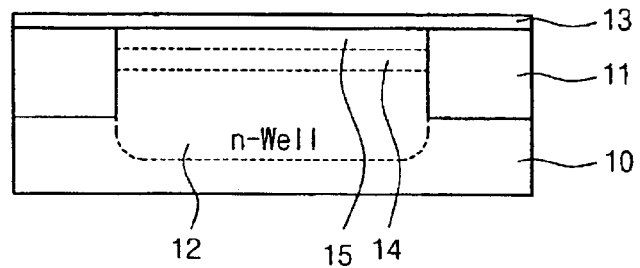
FIGS. 1a to 1c are cross-sectional views, which illustrate a method for fabricating a PMOS transistor according to the prior art.
Figure 1B:
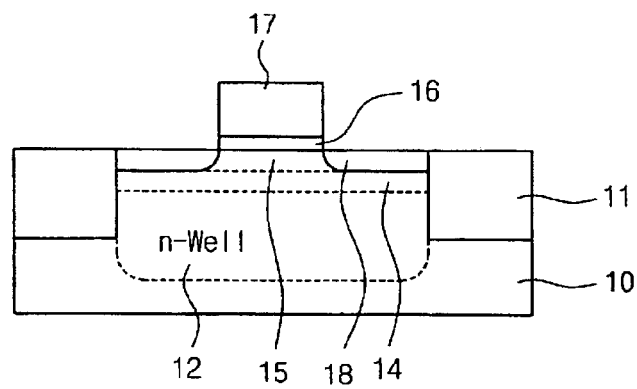
Figure 1C:
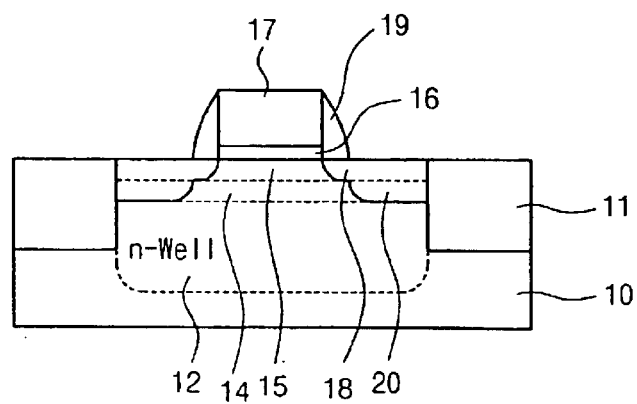
Figure 2A:
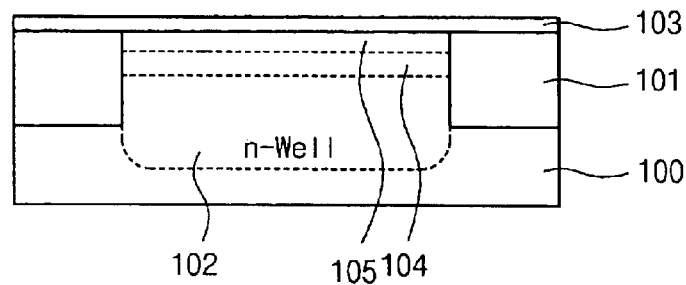
FIGS. 2a to 2c are cross-sectional views, which illustrate a method for fabricating a PMOS transistor according to a preferred embodiment of the present invention.
Figure 2B:
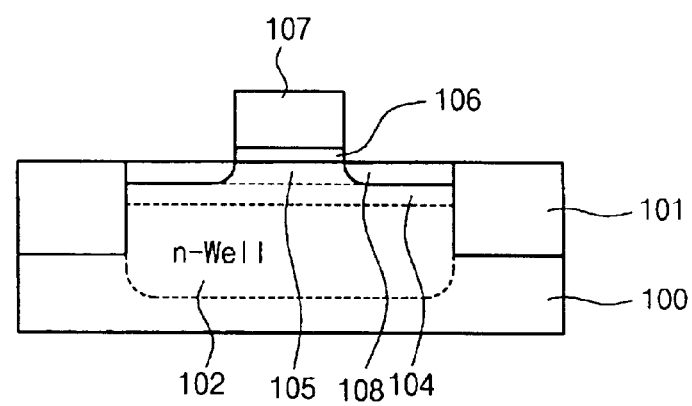
Figure 2C:
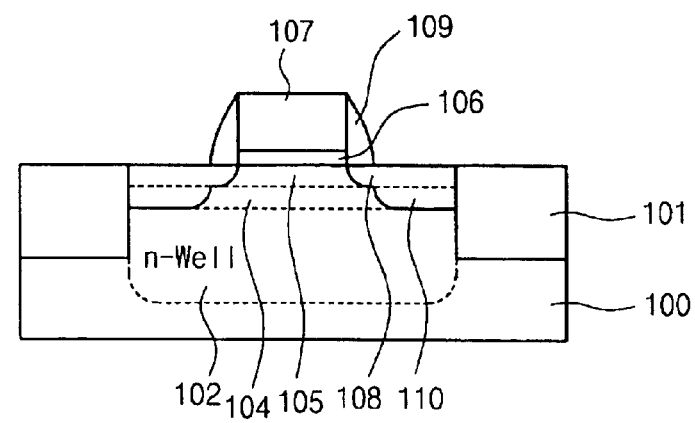

FIGS. 2a to 2c are cross-sectional views, which illustrate a method for fabricating a PMOS transistor according to a preferred embodiment of the present invention.

As shown in FIG. 2a, a device isolation film 101 is formed on a semiconductor substrate 100, after which phosphorus ions ($P^+$) as a first conductive type impurity are implanted into the semiconductor substrate 100 at high concentration, so as to form an n-type well 102 in a semiconductor substrate 100. At this time, ion implantation energy is 1.0E13/500 KeV, and tilt angles are $\alpha=0$ degree and $\beta=0$ degree.

Thereafter, a pad oxide film 103 is deposited on the entire surface of the semiconductor substrate 100 by an oxidation process. A punch-through stopper region 104 is then formed on the upper portion by an ion implantation process. At this time, phosphorus ions (P) as the first conductive impurity are implanted into the punch-through region 104 at intermediate concentration.

In order to control channel threshold voltage, ions are implanted into the upper portion of the semiconductor substrate 100 as to form a channel region 105. At this substrate 100 so as to form a channel region 105. At this time, arsenic (As) ions as the first conductive type impurities are implanted into the channel region 105. The arsenic (As) ions are implanted at the ion implantation energy of 110 to 140 KeV and a fixed tilt angle.

After forming the channel region 105, the pad oxide film 103 is removed. As shown in FIG. 2b, a gate electrode 107 including a gate insulating film 107 is then formed on the semiconductor substrate from which the pad oxide film 103 was removed. Next, using the gate electrode 107 as a mask, impurity ions are implanted into the substrate 100 at low impurity concentration, so that LDD regions 108 are formed in the semiconductor substrate 100 at portions below both sides of the gate electrode 107.

As shown in FIG. 2c, an insulating film is then deposited on the entire structure including the gate electrode 107. Then, the insulating film is etched back, so that insulating spacer films 109 are formed on both sides of the gate electrode 107. Following this, using the insulating spacer films 109 as a mask, impurity ions are implanted into the substrate 100, so as to form source and drain regions 110 in the substrate 100.

Figure 3:
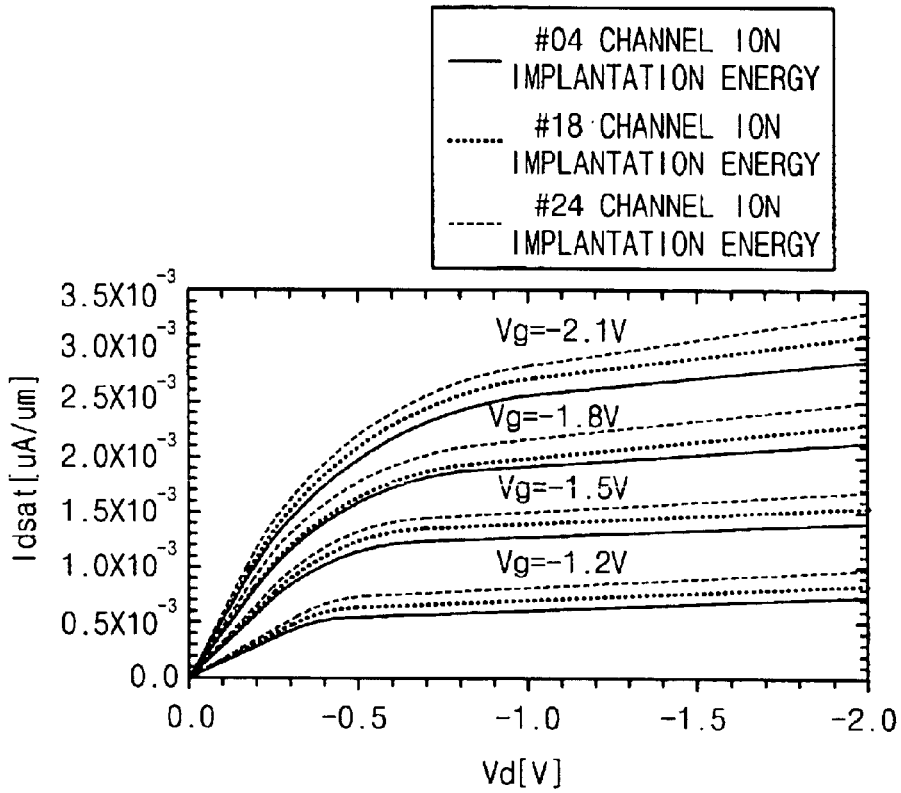
FIG. 3 is a drawing, which shows the relation between drain saturation current (Idsat) and drain voltage (Vd) in a semiconductor transistor device fabricated according to the preferred embodiment of the present invention.

FIG. 3 is a drawing, which shows the relation between drain saturation current (Idsat) and drain voltage (Vd) in a semiconductor transistor device fabricated according to the preferred embodiment of the present invention. As shown in FIG. 3, if tilt angles increase under the condition of the ion implantation energy of 110 to 140 KeV, drain saturation current (Idsat) will gradually increase. Also, gate voltage decreases from −1.2 V to −2.1 V.

As a result, if a channel region is formed according to the preferred embodiment of the present invention, the current driving ability of the resulting PMOS transistor will increase by about 15%.

Figure 4:
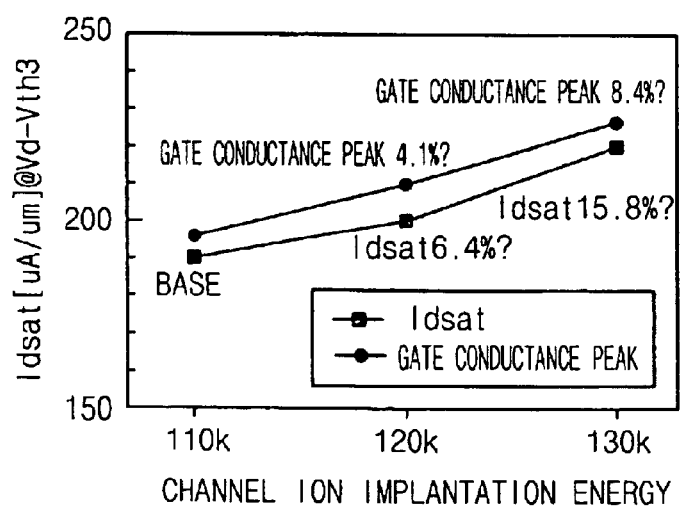
FIG. 4 is a drawing, which shows the gate conductance of a transistor fabricated according to the preferred embodiment of the present invention.

FIG. 4 is a drawing, which shows the gate conductance of a transistor fabricated according to the preferred embodiment of the present invention. FIG. 5 is a drawing, which shows the relation between saturation current and gate conductance according to ion implantation energy, in a transistor fabricated according to the preferred embodiment of the present invention.

As shown in FIGS. 4 and 5, if ion implantation energy increase to 130 KeV, gate conductance will increase by 8.4% and saturation current will increase by 15.8%, without deteriorating the parameter characteristics of the transistor.

In this case, threshold voltage is determined by the doping concentration in a region corresponding to a depth of about 400 Å from the surface of the semiconductor substrate. As a result, there is no change in threshold voltage, since the threshold voltage depends on the doping concentration and the well depth.

As apparent from the foregoing, the method for fabricating the semiconductor transistor device according to the present invention allows the saturation current to be increased by more than 10% without adding separate equipment and processes. Thus, the method of the present invention allows the device reliability and yield to be increased.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor transistor device, which comprises the steps of:

forming a first conductive type well in a semiconductor substrate having a device isolation film formed thereon;

implanting first conductive type impurity ions into first conductive type well, so as to form a punch-through stopper region in the substrate;

implanting the first conductive type impurity ions into the upper portion of the resulting substrate structure at an ion implantation energy of 110 to 140 KeV and a fixed tilt angle, so as to form a channel region in the substrate;

forming a gate electrode including a gate insulating film on the semiconductor substrate;

forming LDD regions in the semiconductor substrate at portions below both sides of the gate electrode;

forming an insulating spacer film on the sides of the gate electrode; and forming source and drain regions in the semiconductor substrate at portions below the sides of the insulating spacer films.

2. The method of claim 1, in which the first conductive type well is formed by implanting phosphorus impurity ions into the substrate.

3. The method of claim 2, in which the phosphorus ions are implanted at an ion implantation energy of 500 KeV, and a tilt angle of 0 degree.

4. The method of claim 1, in which the punch-through stopper region is formed by implanting phosphorus impurity ions into the substrate.

5. The method of claim 1, in which the channel region is formed by implanting arsenic ions as the first conductive type impurity into the substrate.

6. The method of claim 5, in which the arsenic ions are implanted at a tilt angle of 0 degree.

* * * * *